US012777580B2

(12) United States Patent
Van Der Wel

(10) Patent No.: US 12,777,580 B2
(45) Date of Patent: Oct. 27, 2026

(54) SHARED FOOTPRINT FOR FRONTSIDE AND THROUGH-BOARD CONNECTOR ON AN LED MODULE

(71) Applicant: SIGNIFY HOLDING B.V., Eindhoven (NL)

(72) Inventor: Pieter Joseph Clara Van Der Wel, Heerlen (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 169 days.

(21) Appl. No.: 18/856,665

(22) PCT Filed: Apr. 13, 2023

(86) PCT No.: PCT/EP2023/059660
§ 371 (c)(1),
(2) Date: Oct. 14, 2024

(87) PCT Pub. No.: WO2023/202942
PCT Pub. Date: Oct. 26, 2023

(65) Prior Publication Data

US 2025/0234454 A1 Jul. 17, 2025

(30) Foreign Application Priority Data

Apr. 22, 2022 (EP) .................................... 22169409

(51) Int. Cl.
*H05K 1/02* (2006.01)
*H05K 1/181* (2026.01)
(Continued)

(52) U.S. Cl.
CPC ........... *H05K 1/0292* (2013.01); *H05K 1/181* (2013.01); *H05K 3/0011* (2013.01); *F21V 19/001* (2013.01)

(58) Field of Classification Search
CPC ....... H05K 1/292; H05K 1/181; F21V 19/001
See application file for complete search history.

(56) References Cited

U.S. PATENT DOCUMENTS 3,780,431 A 12/1973 Feeney
5,471,016 A 11/1995 Krainer et al.
(Continued)

FOREIGN PATENT DOCUMENTS

| | | | |
|---|---|---|---|
| EP | 1439742 | A1 | 7/2004 |
| JP | H04162486 | A | 6/1992 |
| KR | 100810512 | B1 | 3/2008 |

OTHER PUBLICATIONS

Wago, “Through-Board SMD PCB Terminal Block; 0.75 mm2; Pin spacing 6.5 mm; 1-pole; Push-in CAGE Clamp; in tape-and-reel packaging; 0,75 mm2; white.” 2024.

*Primary Examiner* — Paresh Paghadal

(57) ABSTRACT

The invention provides a system (1000) comprising a printed circuit board (500), wherein: (a) the printed circuit board (500) comprises one or more electrically conductive tracks (200); the printed circuit board (500) comprises a first side (501) and a second side (502); wherein the printed circuit board (500) comprises a main part (510) and an auxiliary part (520); wherein the main part (510) is configured to host one or more electrical components (100), functionally coupled to at least one of the one or more electrically conductive tracks (200); wherein the main part (510) comprises a through hole (550), wherein the through hole (550) at least partially encloses the auxiliary part (520); (b) the printed circuit board (500) comprises a breakaway structure (530) configured between the auxiliary part (520) and the main part (510); wherein the breakaway structure (530) is configured to facilitate disconnection of the auxiliary part (520) from the main part (510); (c) the main part (510) comprises a first connecting hub (251) and a second connecting hub (252), both configured at the first side (501), and configured at opposite sides of the through hole (550); wherein at least one of the first connecting hub (251) and the second connecting hub (252) is electrically connected to at least one of the one or more electrically conductive tracks (200); (d) the auxiliary part (520) comprises a third connecting hub (253), configured at the first side (501), and configured between the first connecting hub (251) and the second connecting hub (252); (e) the printed circuit board (500) is functionally connectable to (i) a front-facing connector unit (610) in a front-facing connector configuration
(Continued)

(600), wherein the front-facing connector unit (610) is connected to (a) the first connecting hub (251) or second connecting hub (252) and (b) the third connecting hub (253), and (ii) a back-facing connector unit (710) in a back-facing connector configuration (700), wherein the auxiliary part (520) is absent, and wherein the back-facing connector unit (710) is partly configured in the through hole (550) and connected to the first connecting hub (251) and the second connecting hub (252).

16 Claims, 2 Drawing Sheets

(51) Int. Cl.
*H05K 3/00* (2006.01)
*F21V 19/00* (2006.01)

(56) References Cited

U.S. PATENT DOCUMENTS

| | | | | |
|---|---|---|---|---|
| 6,164,160 | A * | 12/2000 | Nassar | F16H 61/0009 439/74 |
| 10,943,740 | B2 * | 3/2021 | Koini | H01G 2/06 |
| 2003/0183417 | A1 | 10/2003 | Brown et al. | |
| 2007/0126437 | A1 | 6/2007 | Sul | |
| 2020/0176902 | A1 | 6/2020 | Fu et al. | |
| 2021/0385945 | A1 | 12/2021 | Leermakers et al. | |
| 2023/0361260 | A1 * | 11/2023 | Van Der Wel | H05K 1/189 |
| 2024/0316525 | A1 * | 9/2024 | De Best | B01J 19/123 |

* cited by examiner

SHARED FOOTPRINT FOR FRONTSIDE AND THROUGH-BOARD CONNECTOR ON AN LED MODULE

CROSS-REFERENCE TO PRIOR APPLICATIONS

This application is the U.S. National Phase application under 35 U.S.C. § 371 of International Application No. PCT/EP2023/059660, filed on Apr. 13, 2023, which claims the benefit of European Patent application Ser. No. 22/169,409.4, filed on Apr. 22, 2022. These applications are hereby incorporated by reference herein.

FIELD OF THE INVENTION

The invention relates to a system comprising a printed circuit board. The invention further provides a lighting device comprising such system. Yet, the invention relates to a method for assembling such system.

BACKGROUND OF THE INVENTION

The use of printed circuit boards with breakaway structures is known in the art. U.S. Pat. No. 3,780,431A, for instance, describes a process for producing calculator printed circuit boards, wherein a pallet consisting of a plurality of printed circuit boards are interconnected by snap-away perforated edges at the adjacent side of the boards, so that the pallet consisting of plural boards is processible as a whole. Electrical elements or components have their terminals received through openings in the printed circuit board, which insertion is by machine utilizing a pantographic locating principle. Components are also assembled on the board by hand insertion. After inserting selected electrical components at the desired locations, and masking other locations, the electrical connections are then treated by fountain soldering to form electrical connections between the leads and the printed circuit. The soldering occurs to the pallet as a whole. The individual boards are then snapped apart and the board has enough dimensional stability so that it is rigidly clamped on a fixture and passed over a routing blade at a predetermined slight clearance therefrom so that all of the excess lead sections are trimmed from the subsurface of the printed circuit substrate. Further electrical devices can then be added and soldered in place and the printing circuit board together with its electrical components can then be positioned within a container for a computer application. The described process incorporates minimal handling and incorporates high speed machine assembly techniques wherein multiple operations occur simultaneously or repetitively at high speed.

SUMMARY OF THE INVENTION

Chip scale packaged (CSP) LEDs are being increasingly used in various applications because of its robust structure and attractive pricing. As opposed to the packaged LEDs, a CSP LED is placed directly on top of a linear printed circuit board (PCB). However, this configuration may limit the accessibility of connectors to the electrically connective track on the PCB. The most popular connectors are so-called 'poke-in' connectors which predominantly are used as a front connector, directly facing a side of the PCB with an electrically connective track. In the case of PCBs that have limited accessibility on a side with an electrically connective track (e.g. because a CSP LED has been placed directly on top of the PCB), such poke-in connectors may also be used as a through-board connector, thereby accessing the same electrically connective track on the PCB as the front connectors. As linear LED modules are becoming increasingly smaller, the footprints required for these front connectors and through-board connectors together on the same PCB use up board space that could be used for other applications such as routing or thermal spreading.

Hence, it is an aspect of the invention to provide an alternative printed circuit board, which preferably further at least partly obviates one or more of above-described drawbacks. The present invention may have as object to overcome or ameliorate at least one of the disadvantages of the prior art, or to provide a useful alternative.

In a first aspect, the invention provides a system comprising a printed circuit board (PCB). Especially, the PCB comprises one or more electrically conductive tracks. In embodiments, the PCB may comprise a first side and a second side. Further, the PCB may comprise a main part and an auxiliary part. In specific embodiments, the main part may be configured to host one or more electrical components, which may be functionally coupled to at least one of the one or more electrically conductive tracks. Especially, the main part may comprise a through hole, which may at least partially encloses the auxiliary part. In embodiments, the PCB may comprise a breakaway structure configured between the auxiliary part and the main part. Especially, the breakaway structure may be configured to facilitate disconnection of the auxiliary part from the main part. In embodiments, the main part may comprise a first connecting hub and a second connecting hub. Especially, both of which may be configured at the first side, and configured at opposite sides of the through hole. Further, at least one of the first connecting hub and the second connecting hub may be electrically connected to at least one of the one or more electrically conductive tracks. In embodiments, the auxiliary part may comprise one third connecting hub. Especially, the third connecting hub may be configured at the first side, and may be configured between the first connecting hub and the second connecting hub. In embodiments, the PCB may be functionally connectable to a front-facing connector unit in a front-facing connector configuration (or "front-facing configuration"). Especially, in such a front-facing connector configuration, the front-facing connector unit may be connected to (a) the first connecting hub or the second connecting hub and (b) the third connecting hub. Yet further, the PCB may be functionally connectable to a back-facing connector unit in a back-facing connector configuration (or "back-facing configuration"). Especially, in such a back-facing connector configuration, the auxiliary part may be absent. Further, the back-facing connector unit may be partly configured in the through hole. Yet further, the back-facing connector unit may be connected to the first connecting hub and the second connecting hub. Therefore, in embodiments the invention provides a system comprising a PCB, wherein the PCB comprises one or more electrically conductive tracks; the PCB comprises a first side and a second side; wherein the PCB comprises a main part and an auxiliary part; wherein the main part is configured to host one or more electrical components, functionally coupled to at least one of the one or more electrically conductive tracks; wherein the main part comprises a through hole, wherein the through hole at least partially encloses the auxiliary part; the PCB comprises a breakaway structure configured between the auxiliary part and the main part; wherein the breakaway structure is configured to facilitate disconnection of the auxiliary part from the main part; the main part comprises a first connecting hub and a second connecting hub, both configured at the first side, and configured at opposite sides of the through hole; wherein at least one of the first connecting hub and the second connecting hub is electrically connected to at least one of the one or more electrically conductive tracks; the auxiliary part comprises one third connecting hub, configured at the first side, and configured between the first connecting hub and the second connecting hub; the PCB is functionally connectable to (i) a front-facing connector unit in a front-facing connector configuration, wherein the front-facing connector unit is connected to (a) the first connecting hub or the second connecting hub and (b) the third connecting hub, and (ii) a back-facing connector unit in a back-facing connector configuration, wherein the auxiliary part is absent, and wherein the back-facing connector unit is partly configured in the through hole and connected to the first connecting hub and the second connecting hub.

With the present system, the PCB comprising system ("PCB") may facilitate either a front-facing or a back-facing connector unit to be connected to the electrically conductive track of the PCB comprising system with a minimum amount of board space required. Especially, this may free up board space on the PCB comprising system that would otherwise be taken up by the footprints of both a front-facing and back-facing connector unit. This may allow for the freed up board space on the PCB to be used for alternative PCB functionalities such as routing and thermal spreading. Yet further, this may facilitate production of smaller linear PCBs, which may be important for the desired end product. With the present invention, also late-stage assembly is facilitated, as the PCB may be used for front-facing or back-facing connectors, which may be decided when assembling a device comprising the PCB. Inventor analyzed a large database of connector units, and observed that front-facing connector units usually have a more compact footprint compared to back-facing connector units.

As indicated above, the system may comprise a PCB and optionally a light source. Especially, the system comprises the PCB and the light source(s) functionally coupled to the PCB.

Hence, the term "system" may refer to a PCB as such (such as described herein), to a PCB with a functional component, such as a light source, and to such PCB and the light source functionally coupled thereto. Elements of the system are described in more detail below. Term "system" may also refer to a device comprising such PCB and/or to a housing enclosing such PCB, etc.

Especially, the board may comprise one or more of a CEM-1 PCE, a CEM-3 PCE, a FR-1 PCE, a FR-2 PCB, a FR-3 PCB, a FR-4 PCB, and aluminum metal core PCB, especially one or more of a CEM-1 PCB, a CEM-3 PCB, a FR-1 PCB, and a FR4 PCB and an aluminum metal core PCB, more especially one or more of a CEM-1 PCB, a CEM-3 PCB, a FR-1 PCB. Especially, the PCB comprises a metal core PCB. Therefore, in embodiments the PCB comprises a thermally conductive material, such as aluminum. PCBs comprising a metal core may also be indicated as insulated metal substrate (IMS).

The PCB may comprise a plurality of layer elements. The term "layer element" may refer to a single layer or to a plurality of layers. Essentially all layers describe herein are comprised by a stack or laminate. Hence, the PCB may comprise a stack (or laminate) of layers. This stack may also be indicated as "PCB stack". The number of layers and type of layers may vary over the PCB. Basically, in embodiments the PCB may comprise over its entire length and width a (PCB) stack of layers comprising the first layer element and the second layer element.

Herein, the term "contact" or "in contact", and similar terms, may especially refer in embodiments to physical contact. For instance, the layers or layer elements that are in contact may adhere to each other, as known in the art of e.g. PCBs. Instead of the term "electrical contact", and similar terms, also the terms "electrical conductive contact" or "electrically conductive contact", and similar terms, may be used.

Herein, the term "functionally coupled" may in embodiments refer to a physical connection or mechanical connection between at least two elements, such as via one or more of a screw, a solder, an adhesive, a melt connection, a click connection, etc. The terms "physical connection" and "mechanical connection" may herein interchangeably be used. The terms "physical connection" and "mechanical connection" may thus also refer to an adhesive connection. Alternatively or additionally, the term "functionally coupled" may in embodiments refer to an electrical conductive connection between at least two connections. When two (or more) elements have an electrical conductive connection, then there may be a conductivity (at room temperature) between the two (or more) elements of at least $1\cdot10^5$ S/m, such as at least $1\cdot10^6$ S/m. In general, an electrically conductive connection will be between two (or more) elements each comprising an electrically conductive material, which may be in physical contact with each other or between which an electrically conductive material is configured. Herein a conductivity of an insulated material may especially be equal to or smaller than $1\cdot10^{-10}$ S/m, especially equal to or smaller than $1\cdot10^{-13}$ S/m. Herein a ratio of an electrical conductivity of an isolating material (insulator) and an electrical conductivity of an electrically conductive material (conductor) may especially be selected smaller than $1\cdot10^{-15}$. In specific embodiments, a functional coupling may also comprise a coupling via wireless communication, such a via Wi-Fi or BlueTooth or LiFi, etc.

An electrically conductive element may comprise, or essentially consist of electrically conductive material. An electrically insulating element may comprise, or essentially consist of electrically insulating material. Herein, in embodiments a conductive material may especially comprise a conductivity (at room temperature) of at least $1\cdot10^5$ S/m, such as at least $1\cdot10^6$ S/m. Herein, a conductivity of an insulated material may especially be equal to or smaller than $1\cdot10^{-10}$ S/m, especially equal to or smaller than $1\cdot10^{-13}$ S/m. Herein a ratio of an electrical conductivity of an isolating material (insulator) and an electrical conductivity of an electrically conductive material (conductor) may especially be selected smaller than $1\cdot10^{-15}$.

An electrically conductive contact may refer to a (physical) contact between two (or more) electrically conductive elements, such as between an electrically conductive track and an electrically conductive hub. When in such embodiments the electrical conductivity of the arrangement of the two conductive elements measured over the two conductive elements be at least $1\cdot10^6$ S/m, then there is electrically conductive contact. It may also refer in specific embodiments to an arrangement of two (or more) electrically conductive elements with a medium in between. When in such embodiments the electrical conductivity of the arrangement of the two conductive elements measured over the two conductive elements with the medium in between, be at least $1\cdot10^6$ S/m, then there is also electrically conductive contact.

In embodiments, the PCB may comprise one or more electrically conductive elements. Especially, such electrically conductive element may comprise a layer element. The term "electrically conductive track" may be used to referrer to such an electrically conductive layer element. An electrically conductive track may comprise a metal layer. For instance, in embodiments the metal layer may be an aluminum layer. Instead of (or in addition to) aluminum, the metal layer may comprise a copper layer. For instance, in embodiments the metal layer may be a copper layer. Other solutions may also be possible, like stainless steel, other metals, or (their) metal alloys. Especially, the electrically conductive track may comprise a metal core of the PCB. Especially, the electrically conductive track may be available over essentially the entire PCB. In embodiments, the term "electrically conductive element" may especially refer to an electrically conducive track.

In embodiments, an external electricity source may provide a (constant) electric current to the electrically conductive elements of the system via electrically conductive wires that may be inserted into electrically conductive connector units. Such connector units may facilitate the delivery of a constant electric current to the PCB and the electrical components that are comprised by the system. Especially, such connector units may be placed on the same electrically conductive copper layer comprised by an electrically conductive track on a PCB and deliver the constant electric current through the electrically conductive track.

Hence, the first electrically conductive track may facilitate delivery of the constant electric current from the external electricity source to the system. Further, it may provide a support function and may have a thermal dissipation function and/or a thermal spread function.

The PCB may have a first side and a second side. In embodiments, at least part of the first side may in embodiments be facing one or more electrical components (see also below). Further, the PCB may comprise a main part. In embodiments, the main part may be configured to host one or more electrical components. Especially, the main part may in embodiments be functionally coupled to at least one of the one or more electrically conductive tracks. Hence, the main part of the PCB may provide the board space for one or more functional components and may provide a support function (therefore).

In embodiments, the PCB may further comprise a through hole. Especially, the PCB may comprise a plurality of through holes. More especially, the PCB may comprise a minimum of one to a maximum of eight through holes.

Further, the PCB may comprise an auxiliary part. In embodiments, the auxiliary part may be at least partially enclosed by the through hole. The main part may partially enclose the through hole which in turn may partially enclose the auxiliary part. Especially, in embodiments, the through hole may enclose the auxiliary part from at least three sides of the auxiliary part. In embodiments, the auxiliary part is composed of the same material as the PCB. Especially, the auxiliary part may yet be connected to the main part of the PCB.

The PCB may comprise a breakaway structure configured between the auxiliary part and the main part. The breakaway structure may be configured to facilitate disconnection of the auxiliary part from the main part. Preferably, in embodiments the breakaway structure may be a perforation line which may allow disconnecting the auxiliary part from the main part through the application of pressure on the auxiliary part. In other embodiments, the breakaway structure may be a partial V-cut line. In yet other embodiments, the breakaway structure may be a cut line guiding the action of cutting, sawing, grinding, hacking, laser cutting, etc. In such embodiments where the through hole may enclose the auxiliary part from at least three sides of the auxiliary part, the breakaway structure may be configured at a fourth side of the auxiliary part.

Hence, the breakaway structure may allow for the auxiliary part to be disconnected from the main part when that is desirable for the end product. In embodiments, disconnecting the auxiliary part from the main part may provide further space in the through hole. Hence, the auxiliary part can be broken from the main part via the breakaway structure. For instance, by applying a pressure on the auxiliary part, the auxiliary part can be disconnected from the main part.

The main part may further comprise a first connecting hub and a second connecting hub. In embodiments, both the first and second connecting hub may be electrically conductive elements. The first and second connecting hub may comprise a metal material. Especially, such metal material may be aluminum or copper or a combination of both, especially copper. The first and second connecting hub may further comprise metal solder islands. Especially, the metal solder islands may comprise aluminum or copper, especially copper. In further embodiments, the first and second connecting hub may comprise a copper island.

Both the first and second connecting hub may be configured at the first side. Further, both the first and second connecting hub may be configured at opposite sides of the through hole (at the first side). In embodiments at least one of the first connecting hub and the second connecting hub may be electrically connected to at least one of the one or more electrically conductive tracks. Especially, in embodiments both the first connecting hub and the second connecting hub may be electrically connected to at least one of the one or more electrically conductive tracks.

Hence, the first and second connecting hubs may in embodiments facilitate electrical connectivity between the electrically conductive track of the PCB and connector units.

The auxiliary part may in embodiments comprise a third connecting hub. This third connecting hub may be configured at the first side. Further, the third connecting hub may be configured between the first connecting hub and the second connecting hub. Especially, the third connecting hub may be configured closer to the first connecting hub than to the second connecting hub. The third connecting hub may in embodiments be composed of the same material as the first and second connecting hub. However, unlike the first and second connecting hub, the third connecting hub may in specific embodiments not be connected to the electrically conductive track.

For example, the front-facing and/or back-facing connector(s) may have a single/one polarity (e.g. positive or negative polarity). In embodiments, the third connecting hub may not be electrically connected to any of the one or more electrically conductive tracks. E.g. due to a break or breakaway feature between the first and the third connection hub, electrical connection between the third connecting hub to any of the one or more electrically conductive tracks is not desired because it would be prone to mall-functioning of the system. The third hub may be meant for mechanical fixation only.

In yet other embodiments, the third connecting hub may be connected to the electrically conductive track like the first connecting hub and the second connecting hub. Especially, also the third connecting hub is configured at the first side.

Hence, the third connecting hub may provide an additional position for connectivity between the PCB and connector units located on the auxiliary part. In specific embodiments, this connectivity may be mechanical rather than electrical. However, an electrical connection between the third connecting hub and e.g. the first connecting hub is herein not excluded.

As the auxiliary part may be disconnectable in embodiments, the third connecting hub provides adaptability in that it may remain in desired configurations or may be removed in other configurations.

The PCB may be mechanically and electrically connectable to a front-facing connector unit or back-facing connector unit. In embodiments, such connector unit may comprise an electrically conductive element and a connector unit housing. The electrically conductive element may comprise a metal material. Especially, the electrically conductive element may comprise aluminum or copper, especially copper. In embodiments, the electrically conductive element may be electrically connected to both the PCB and one or more electrical components. Hence, the electrically conductive element in the connector unit may facilitate the functional coupling of the PCB to one or more electrical components.

The connector unit housing may comprise plastic, glass, metal, or a combination of such materials. It may comprise a housing support, connector plugs and connector pads. The housing support may provide mechanical support and shelter the electrically conductive element. The connector plugs may provide openings for electrically connecting the electrically conductive element in the connector unit to the electrically conductive element in one or more electrical components. The connector pads may be connected to solder pads on the PCB, and may facilitate mechanical and electrical connection between the PCB and the connector unit. Hence, the connector unit housing may support and shelter the electrically conductive element in the connector unit and may facilitate connecting to the PCB and electrical component.

In embodiments, the connector unit may be a poke-in connector type. Especially, the poke-in connector unit may be an n-pin connector type. Especially, the n-pin connector may have n selected from 1-4. Such n-pin connectors allow connection to one or more electrical components via electrical pins which may be inserted in the connector plugs. In embodiments, different pins connected to the connector unit may connect to different electrically conductive tracks on the PCB. Especially, n-pin connectors with n selected from 1-4 may be connected to 1-4 electrically conductive tracks.

The PCB may be mechanically and electrically connectable to a front-facing connector unit in a front-facing connector configuration. In such configuration, the front-facing connector unit may be connected to the second connecting hub and the third connecting hub. Especially, in such configuration, the auxiliary part may remain connected to the PCB and provides the third connecting hub as an additional position to connect the front-facing connecting unit.

Further, the PCB may be mechanically and electrically connectible to a back-facing connector unit in a back-facing connector configuration. In such configuration, the auxiliary part may be absent. Especially, the auxiliary part may be removed by removal from the PCB by disconnecting via the breakaway structure. Hence, the removal of the auxiliary part may open up space in the through hole. In such configuration, the back-facing connector unit may be partly configured in the through hole. The back-facing connector unit may then further be connected to the first connecting hub and the second connecting hub.

Hence, the invention may provide a system with two selectable configurations. A front-facing configuration may be desirable if ample space is available between the first side and the functional components or housing. In such configuration, the auxiliary part may remain connected to the PCB and the front-facing connector unit may be connected to the second and third connecting hub. A back-facing configuration may be desirable if little space is available between the first side and the functional components or housing. In such configuration, the auxiliary part may be removed from the PCB and the back-facing connector unit may be connected to the first connecting hub and the second connecting hub. These configurations may provide the system with adaptability towards different end-products depending on the desired end-products. Note that in an application in general either the front-facing configuration or the back-facing configuration is used. Hence, in embodiments a combination of both configurations is not applied simultaneously for the same PCB.

Therefore, in embodiments the system may further comprise the front-facing connector unit. The front-facing connector unit may comprise two front-facing connector hubs. The two front-facing connector hubs may be electrically connected to each other. This configuration may allow that a front-facing connector unit can be applied also 180 rotated to said PCB because the electrical connection will be present in both orientations. Further, the front-facing connector unit may be mechanically and electrically coupled to the PCB in the front-facing connector configuration. The second connecting hub and the third connecting hub may be each connected to respective front-facing connector hubs. Especially, in such embodiments, the front-facing connector unit may comprise two front-facing connector hubs, which are electrically connected to each other. Especially, the front-facing connector unit may be (functionally coupled or) connected to (a) the first connecting hub or the second connecting hub and (b) the third connecting hub via solder connections.

In (alternative) embodiments, the system may further comprise the back-facing connector unit. The back-facing connector unit may comprise two back-facing connector hubs. The two back-facing connector hubs may be electrically connected to each other. This configuration may allow that a back-facing connector unit can be applied also 180 rotated to said PCB because the electrical connection will be present in both orientations. Further, the back-facing connector unit may be mechanically and electrically coupled to the PCB in the back-facing connector configuration. The first connecting hub and the third connecting hub may be each connected to respective back-facing connector hubs. Especially, in such embodiments, the back-facing connector unit may comprise two back-facing connector hubs, which are electrically connected to each other. Especially, the back-facing connector unit may be (functionally coupled or) connected to the first connecting hub and the second connecting hub via solder connections.

Hence, the connector units may comprise connector hubs which facilitate electrical conductivity with the connecting hubs comprised by the PCB, which may thereby provide the constant electric current to the electrical components.

In a further aspect, the invention may provide a method for assembly of the system as e.g. described in embodiments above. The method may comprise providing in a first stage the PCB as defined in any of the embodiments above with a functional component. Especially, the functional component may be a light source.

The method may further comprise a second stage subsequent to the first stage. The second stage may comprise mechanically and electrically connecting the front-facing connector unit in the front-facing connector configuration, wherein the front-facing connector unit may be connected to (a) the first connecting hub or the second connecting hub and (b) the third connecting hub. Alternatively, the second stage may comprise removing the auxiliary part from the PCB by disconnecting via the breakaway structure. Next, the (second) stage may comprise mechanically and electrically connecting the back-facing connector unit in the back-facing connector configuration, wherein the back-facing connector unit may be partly configured in the through hole. Further, the back-facing connector unit may be connected to the first connecting hub and the second connecting hub.

Especially, the functional component may comprise an electronic component, more especially an electronic component selected from the group comprising a solid state light source, a driver, an electronic module, or a sensor. Especially, the electronic component may comprise a solid state light source.

The term "light source" may in principle relate to any light source known in the art. It may be a conventional (tungsten) light bulb, a low pressure mercury lamp, a high pressure mercury lamp, a fluorescent lamp, a LED (light emissive diode). In a specific embodiment, the light source comprises a solid state LED light source (such as a LED or laser diode (or "diode laser")). The term "light source" may also relate to a plurality of light sources, such as 2-2000 (solid state) LED light sources. Hence, the term LED may also refer to a plurality of LEDs. Further, the term "light source" may in embodiments also refer to a so-called chips-on-board (COB) light source. The term "COB" especially refers to LED chips in the form of a semiconductor chip that is neither encased nor connected but directly mounted onto a substrate, such as a PCB. Hence, a plurality of light emitting semiconductor light source may be configured on the same substrate. In embodiments, a COB is a multi LED chip configured together as a single lighting module.

The light source may have a light escape surface. Referring to conventional light sources such as light bulbs or fluorescent lamps, it may be outer surface of the glass or quartz envelope. For LED's it may for instance be the LED die, or when a resin is applied to the LED die, the outer surface of the resin. In principle, it may also be the terminal end of a fiber. The term escape surface especially relates to that part of the light source, where the light actually leaves or escapes from the light source. The light source is configured to provide a beam of light. This beam of light (thus) escapes from the light exit surface of the light source.

Likewise, a light generating device may comprise a light escape surface, such as an end window. Further, likewise a light generating system may comprise a light escape surface, such as an end window.

The term "light source" may refer to a semiconductor light-emitting device, such as a light emitting diode (LEDs), a resonant cavity light emitting diode (RCLED), a vertical cavity laser diode (VCSELs), an edge emitting laser, etc. . . . The term "light source" may also refer to an organic light-emitting diode (OLED), such as a passive-matrix (PMOLED) or an active-matrix (AMOLED). In a specific embodiment, the light source comprises a solid-state light source (such as a LED or laser diode). In an embodiment, the light source comprises a LED (light emitting diode). The terms "light source" or "solid state light source" may also refer to a superluminescent diode (SLED).

The term LED may also refer to a plurality of LEDs.

The term "light source" may also relate to a plurality of (essentially identical (or different)) light sources, such as 2-2000 solid state light sources. In embodiments, the light source may comprise one or more micro-optical elements (array of micro lenses) downstream of a single solid-state light source, such as a LED, or downstream of a plurality of solid-state light sources (i.e. e.g. shared by multiple LEDs). In embodiments, the light source may comprise a LED with on-chip optics. In embodiments, the light source comprises a pixelated single LEDs (with or without optics) (offering in embodiments on-chip beam steering).

In embodiments, the light source may be configured to provide primary radiation, which is used as such, such as e.g. a blue light source, like a blue LED, or a green light source, such as a green LED, and a red light source, such as a red LED. Such LEDs, which may not comprise a luminescent material ("phosphor") may be indicated as direct color LEDs.

In other embodiments, however, the light source may be configured to provide primary radiation and part of the primary radiation is converted into secondary radiation. Secondary radiation may be based on conversion by a luminescent material. The secondary radiation may therefore also be indicated as luminescent material radiation. The luminescent material may in embodiments be comprised by the light source, such as a LED with a luminescent material layer or dome comprising luminescent material. Such LEDs may be indicated as phosphor converted LEDs or PC LEDs (phosphor converted LEDs). In other embodiments, the luminescent material may be configured at some distance ("remote") from the light source, such as a LED with a luminescent material layer not in physical contact with a die of the LED. Hence, in specific embodiments the light source may be a light source that during operation emits at least light at wavelength selected from the range of 380-470 nm. However, other wavelengths may also be possible. This light may partially be used by the luminescent material.

In embodiments, the light generating device may comprise a luminescent material. In embodiments, the light generating device may comprise a PC LED. In other embodiments, the light generating device may comprise a direct LED (i.e. no phosphor). In embodiments, the light generating device may comprise a laser device, like a laser diode. In embodiments, the light generating device may comprise a superluminescent diode. Hence, in specific embodiments, the light source may be selected from the group of laser diodes and superluminescent diodes. In other embodiments, the light source may comprise an LED.

The light source may especially be configured to generate light source light having an optical axis (O), (a beam shape) and a spectral power distribution. The light source light may in embodiments comprise one or more bands, having band widths as known for lasers.

The term "light source" may (thus) refer to a light generating element as such, like e.g. a solid state light source, or e.g. to a package of the light generating element, such as a solid state light source, and one or more of a luminescent material comprising element and (other) optics, like a lens, a collimator. A light converter element ("converter element" or "converter") may comprise a luminescent material comprising element. For instance, a solid state light source as such, like a blue LED, is a light source. A combination of a solid state light source (as light generating element) and a light converter element, such as a blue LED and a light converter element, optically coupled to the solid state light source, may also be a light source (but may also be indicated as light generating device). Hence, a white LED is a light source (but may e.g. also be indicated as (white) light generating device).

The term "light source" herein may also refer to a light source comprising a solid state light source, such as an LED or a laser diode or a superluminescent diode.

The "term light source" may (thus) in embodiments also refer to a light source that is (also) based on conversion of light, such as a light source in combination with a luminescent converter material. Hence, the term "light source" may also refer to a combination of a LED with a luminescent material configured to convert at least part of the LED radiation, or to a combination of a (diode) laser with a luminescent material configured to convert at least part of the (diode) laser radiation.

In embodiments, the term "light source" may also refer to a combination of a light source, like a LED, and an optical filter, which may change the spectral power distribution of the light generated by the light source. Especially, the "term light generating device" may be used to address a light source and further (optical components), like an optical filter and/or a beam shaping element, etc.

The phrases "different light sources" or "a plurality of different light sources", and similar phrases, may in embodiments refer to a plurality of solid-state light sources selected from at least two different bins. Likewise, the phrases "identical light sources" or "a plurality of same light sources", and similar phrases, may in embodiments refer to a plurality of solid-state light sources selected from the same bin.

The term "solid state light source", or "solid state material light source", and similar terms, may especially refer to semiconductor light sources, such as a light emitting diode (LED), a diode laser, or a superluminescent diode.

Here below, the invention is essentially further described in relation to a light source (as functional component, such as an electronic component). However, other electrical components may also be available, and may be functionally coupled to the PCB.

The invention provides in embodiments the PCB as such, which can be used to host one or more light sources, especially at dedicated positions or parts, wherein (also) the third layer element is available. The invention also provides in embodiments the PCB including the light source. In such embodiments, the system may also be indicated as "light generating system" or "lighting system".

Hence, in embodiments the system further comprises the light source. Especially, the light source is functionally coupled to the PCB. The light source may especially be configured to generate light ("light source light"), during operation of the light source.

Hence, especially in embodiments the light source is functionally coupled to the PCB, and the light source is configured to generate light (during operation of the light source). More especially, the light source may comprise a solid state light source, such as a CSP LED.

In general, the light source, or other functional component, may comprise at least two, such as two, electrical contacts.

Especially, the term "functional component" may refer to an electrical component. More especially, the functional component comprises one or more electrical components. The term electrical component may especially refer in embodiments to an electronic component.

The electronic component may include an active or a passive electronic component. An active electronic component may be any type of circuit component with the ability to electrically control electron flow (electricity controlling electricity). Examples thereof are diodes, especially light emitting diodes (LED). LEDs are herein also indicated with the more general term solid state lighting devices or solid state light sources. Hence, in embodiments the electronic component comprises an active electronic component. Especially, the electronic component comprises a solid state light source. Other examples of active electronic components may include power sources, such as a battery, a piezo-electric device, an integrated circuit (IC), and a transistor. In an embodiment, the electronic component comprises a driver. In yet other embodiments, the electronic component may include a passive electronic component. Components incapable of controlling current by means of another electrical signal are called passive devices. Resistors, capacitors, inductors, transformers, etc. can be considered passive devices. In an embodiment, the electronic component may include an RFID (Radio-frequency identification) chip. A RFID chip may be passive or active. Especially, the electronic component may include one or more of a solid state light source (such as a LED), a RFID chip, and an IC. The term "electronic component" may also refer to a plurality of alike or a plurality of different electronic components.

As indicated above, in specific embodiments the light source may comprise a chip scale package (CSP). Hence, in specific embodiments a plurality of chip scale package (CSP) may be functionally coupled to the PCB. For each chip scale package (CSP) may apply that the third layer may be configured below the chip scale package (CSP), but may also extend beyond a projection of the chip scale package (CSP) on the second layer (element).

Hence, in specific embodiments, a plurality of light sources, especially chip scale packages, may be functionally coupled to the PCB, where for each of the light sources, especially chip scale packages, may apply that the light source is functionally coupled to fifth layers of different first parts. However, as indicated above, two or more light sources may be coupled to the same first part(s).

The system including a light source may also be indicated as light generating system. Especially, the light source may be configured to generate visible light, though other options may also be possible, like ultraviolet light or infrared light. Optionally, different types of light may be produced by two or more different light sources (during operation of the (light generating) system).

The terms "visible", "visible light" or "visible emission" and similar terms refer to light having one or more wavelengths in the range of about 380-780 nm. Herein, UV may especially refer to a wavelength selected from the range of 190-380 nm, such as 200-380 nm. Herein, IR (infrared) may especially refer to radiation having a wavelength selected from the range of 780-3000 nm, such as 780-2000 nm, e.g. a wavelength up to about 1500 nm, like a wavelength of at least 900 nm, though in specific embodiments other wavelengths may also be possible. Hence, the term IR may herein refer to one or more of near infrared (NIR (or IR-A)) and short-wavelength infrared (SWIR (or IR-B)), especially NIR.

The terms "light" and "radiation" are herein interchangeably used, unless clear from the context that the term "light" only refers to visible light. The terms "light" and "radiation" may thus refer to UV radiation, visible light, and IR radiation. In specific embodiments, especially for lighting applications, the terms "light" and "radiation" refer to (at least) visible light.

The light generating system may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, (outdoor) road lighting systems, urban lighting systems, green house lighting systems, horticulture lighting, digital projection, or LCD backlighting. The light generating system (or luminaire) may be part of or may be applied in e.g. optical communication systems or disinfection systems.

In yet a further aspect, the invention also provides a lamp or a luminaire comprising the light generating system as defined herein. The luminaire may further comprise a housing, optical elements, louvres, etc. etc. . . . The lamp or luminaire may further comprise a housing enclosing the light generating system. The lamp or luminaire may comprise a light window in the housing or a housing opening, through which the system light may escape from the housing. In yet a further aspect, the invention also provides a projection device comprising the light generating system as defined herein. Especially, a projection device or "projector" or "image projector" may be an optical device that projects an image (or moving images) onto a surface, such as e.g. a projection screen. The projection device may include one or more light generating systems such as described herein. Hence, in an aspect the invention also provides a lighting device selected from the group of a lamp, a luminaire, a projector device, a disinfection device, and an optical wireless communication device, comprising the light generating system as defined herein. The lighting device may comprise a housing or a carrier, configured to house or support, one or more elements of the light generating system. For instance, in embodiments the lighting device may comprise a housing or a carrier, configured to house or support one or more LED modules.

Hence, in an aspect the invention also provides a lighting device selected from the group of a lamp, a luminaire, a projector device, a disinfection device, and an optical wireless communication device, comprising the light generating system as defined herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

The schematic drawings are not necessarily to scale.

DETAILED DESCRIPTION OF THE EMBODIMENTS

Figure 1A:
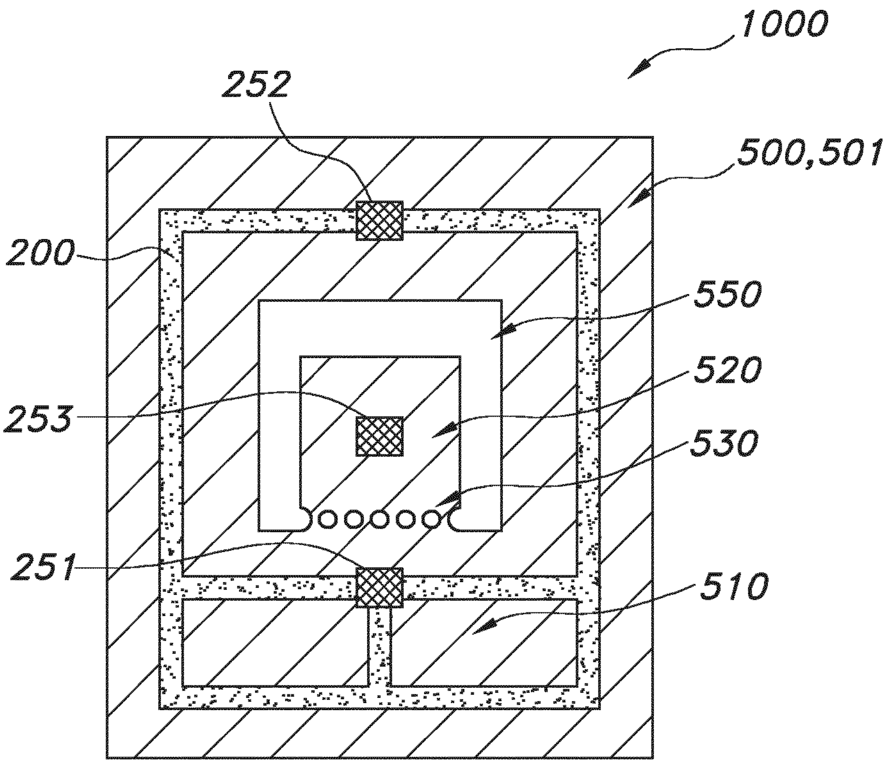
FIG. 1A-C schematically depict embodiments of the system.
Figure 1B:
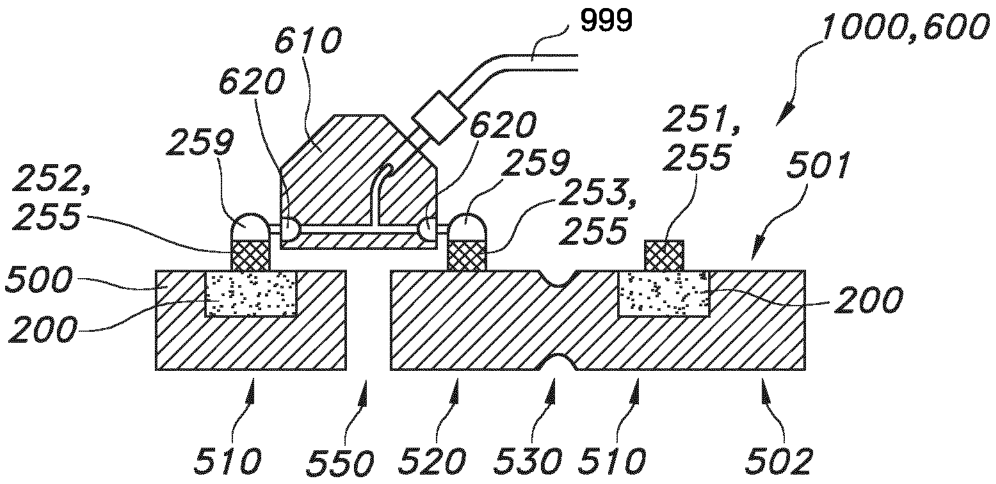
Figure 1C:
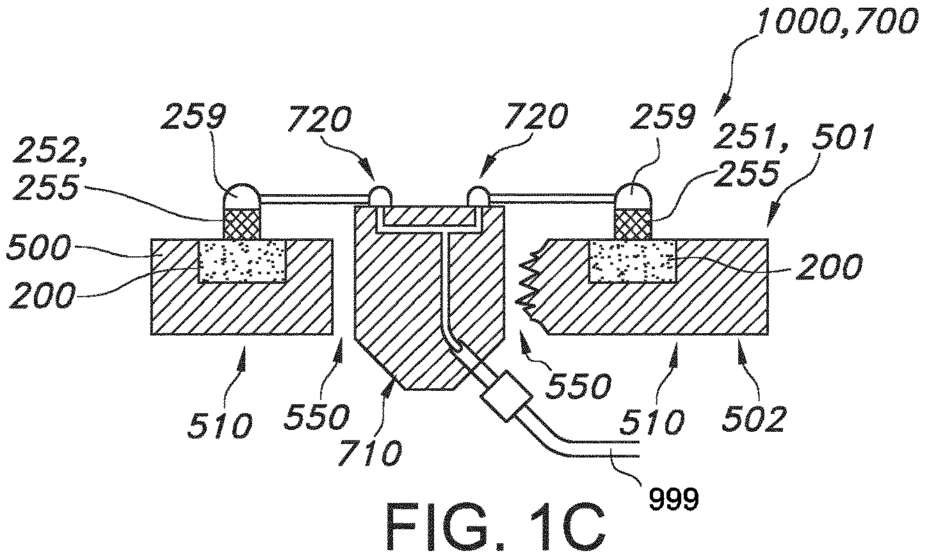

FIG. 1A-C schematically depict a system 1000 comprising a printed circuit board 500. The printed circuit board 500 comprises one or more electrically conductive tracks 200. The printed circuit board 500 comprises a first 501 and a second side 502. The printed circuit board comprises a main part 510 and an auxiliary part 520. The main part 510 is configured to host one or more electrical components 100. The electrical components 100 are functionally coupled to at least one of the one or more electrically conductive tracks 200. The main part 510 comprises a through hole 550. The through hole 550 at least partially encloses the auxiliary part 520. The printed circuit board 500 comprises a breakaway structure 530 configured between the auxiliary part 520 and the main part 510. The breakaway structure 530 is configured to facilitate disconnection of the auxiliary part 520 from the main part 510. The main part 510 comprises a first connecting hub 251 and a second connecting hub 252, both configured at the first 501, and configured at opposite sides of the through hole 550. At least one of the first connecting hub 251 and the second connecting hub 252 is electrically connected to at least one of the one or more electrically conductive tracks 200. The auxiliary part 520 comprises one third connecting hub 253, configured at the first side 501, and configured between the first connecting hub 251 and the second connecting hub 252. The printed circuit board 500 is functionally connectable to a front-facing connector unit 610 in a front-facing connector configuration 600, wherein the front-facing connector unit 610 is connected to (a) the first connecting hub 251 or the second connecting hub 252 and (b) the third connecting hub 253. Further, the printed circuit board 500 is functionally connectable to a back-facing connector unit 710 in a back-facing connector configuration 700, wherein the auxiliary part 520 is absent, the back-facing connector unit 710 is partly configured in the through hole 550, and the back-facing connector unit 710 is connected to the first connecting hub 251 and the second connecting hub 252.

In embodiments, the breakaway structure 530 comprises a perforation line.

In embodiments, the one or more of the first connecting hub 251, the second connecting hub 252, and the third connecting hub 253 comprise a copper island 255.

In embodiments, the third connecting hub 253 is not electrically connected to any of the one or more electrically conductive tracks 200.

In embodiments, the through hole 550 encloses the auxiliary part 520 from at least three sides of the auxiliary part 520, and the breakaway structure 530 is configured at a fourth side of the auxiliary part 520.

FIG. 1B schematically depicts specific embodiments, wherein the front-facing connector unit 610 comprises two front-facing connector hubs 620, which are electrically connected to each other. The front-facing connector unit 610 is functionally coupled to the printed circuit board 500 in the front-facing connector configuration 600. The (a) first connecting hub 251 or the second connecting hub 252 and (b) the third connecting hub 253 are each connected to a respective front-facing connector hub 620.

In embodiments, the front-facing connector 610 comprises two front-facing connector hubs 620, which are electrically connected to each other. In embodiments, the front-facing connector unit 610 is connected to (a) the first connecting hub or the second connecting hub 252 and (b) the third connecting hub 253 via solder connections 259.

In embodiments, the system may further comprise an electricity source (e.g. a system driver) for providing an electric current to the electrically conductive tracks of the system via one or more electrically conductive wires 999 which are inserted into one or more of the connector units 610,710. E.g. the system driver may be connected to the mains.

FIG. 1C schematically depicts specific embodiments, wherein the back-facing connector unit 710 comprises two back-facing connector hubs 720, which are electrically connected to each other. The back-facing connector unit 710 is functionally coupled to the printed circuit board 500 in the back-facing connector configuration 700. The first connecting hub 251 and the second connecting hub 252 are each connected to one of the two back-facing connector hubs 720.

In embodiments, the back-facing connector unit 710 comprises two back-facing connector hubs 720, which are electrically connected to each other. In embodiments, the back-facing connector unit 710 is connected to the first connecting hub 251 and the second connecting hub 252 via solder connections 259.

In embodiments, the system may further comprise an electricity source (e.g. a system driver) for providing an electric current to the electrically conductive tracks of the system via one or more electrically conductive wires 999 which are inserted into one or more of the connector units 610,710. E.g. the system driver may be connected to the mains.

Figure 2:
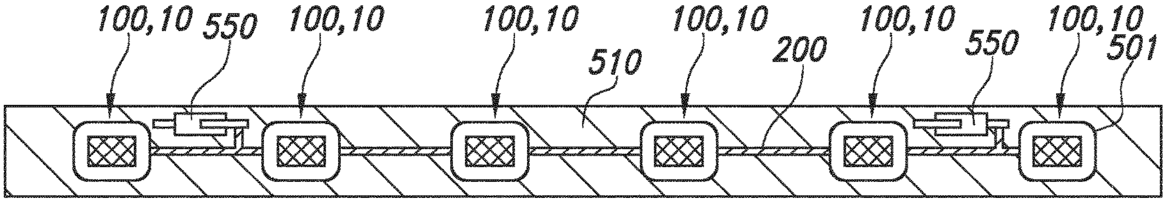
FIG. 2 schematically depicts further embodiments of the system.

FIG. 2 schematically depicts such embodiments where the one or more electrical components 100 comprise a solid state light source 10. In embodiments, the printed circuit board 500 comprises a plurality of holes 550.

In embodiments (not depicted), the system 1000 comprises at least two electrically conductive tracks 200, wherein the front-facing connector unit 610 is a two pin connector, or wherein the back-facing connector 710 is a two pin connector.

Figure 3:
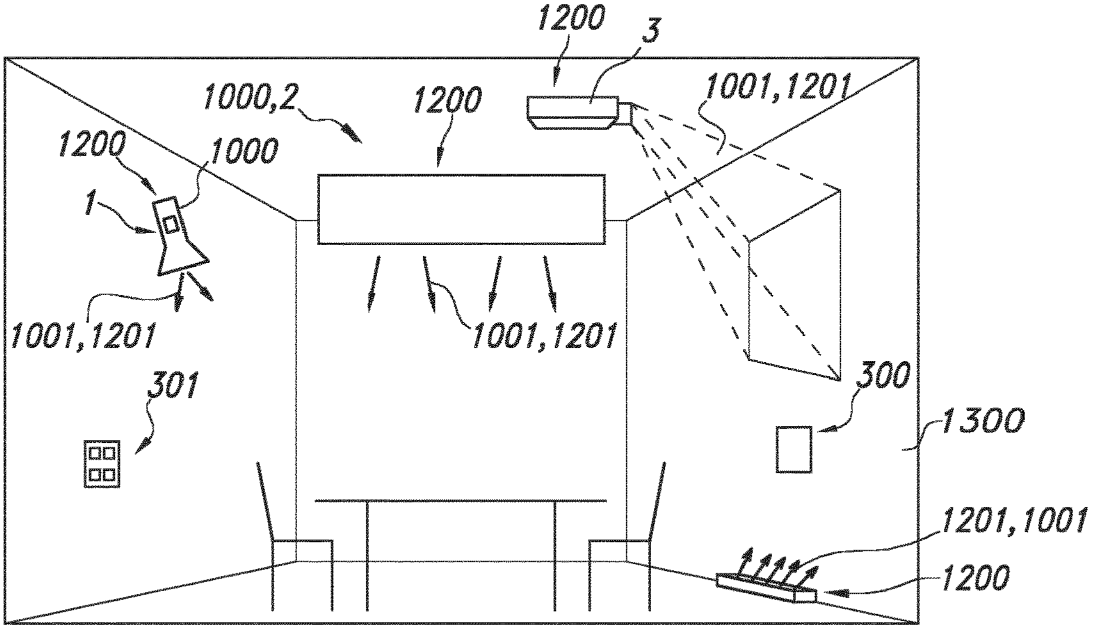
FIG. 3 schematically depicts some applications embodiments of the system.

FIG. 3 schematically depicts an embodiment of a luminaire 2 comprising the light generating system 1000 as described above. Reference 301 indicates a user interface which may be functionally coupled with the control system 300 comprised by or functionally coupled to the light generating system 1000. FIG. 3 also schematically depicts an embodiment of lamp 1 comprising the light generating system 1000. Reference 3 indicates a projector device or projector system, which may be used to project images, such as at a wall, which may also comprise the light generating system 1000. Hence, FIG. 3 schematically depicts embodiments of a lighting device 1200 selected from the group of a lamp 1, a luminaire 2, a projector device 3, a disinfection device, a photochemical reactor, and an optical wireless communication device, comprising the light generating system 1000 as described herein. In embodiments, such lighting device may be a lamp 1, a luminaire 2, a projector device 3, a disinfection device, or an optical wireless communication device. Lighting device light escaping from the lighting device 1200 is indicated with reference 1201. Lighting device light 1201 may essentially consist of system light 1001, and may in specific embodiments thus be system light 1001. Reference 1300 refers to a space, such as a room.

Hence, the system 1000 may further comprise a control system (or be functionally coupled to a control system), configured to control the electronic component, such as especially the light source(s). Hence, in embodiments, the control system may control in dependence of one or more of an input signal of a user interface, a sensor signal (of a sensor), and a timer. The term "timer" may refer to a clock and/or a predetermined time scheme.

The term "controlling" and similar terms especially refer at least to determining the behavior or supervising the running of an element. Hence, herein "controlling" and similar terms may e.g. refer to imposing behavior to the element (determining the behavior or supervising the running of an element), etc., such as e.g. measuring, displaying, actuating, opening, shifting, changing temperature, etc. Beyond that, the term "controlling" and similar terms may additionally include monitoring. Hence, the term "controlling" and similar terms may include imposing behavior on an element and also imposing behavior on an element and monitoring the element. The controlling of the element can be done with a control system, which may also be indicated as "controller". The control system and the element may thus at least temporarily, or permanently, functionally be coupled. The element may comprise the control system. In embodiments, the control system and element may not be physically coupled. Control can be done via wired and/or wireless control. The term "control system" may also refer to a plurality of different control systems, which especially are functionally coupled, and of which e.g. one control system may be a master control system and one or more others may be slave control systems. A control system may comprise or may be functionally coupled to a user interface.

The control system may also be configured to receive and execute instructions form a remote control. In embodiments, the control system may be controlled via an App on a device, such as a portable device, like a Smartphone or I-phone, a tablet, etc. The device is thus not necessarily coupled to the lighting system, but may be (temporarily) functionally coupled to the lighting system.

Hence, in embodiments the control system may (also) be configured to be controlled by an App on a remote device. In such embodiments the control system of the lighting system may be a slave control system or control in a slave mode. For instance, the lighting system may be identifiable with a code, especially a unique code for the respective lighting system. The control system of the lighting system may be configured to be controlled by an external control system which has access to the lighting system on the basis of knowledge (input by a user interface of with an optical sensor (e.g. QR code reader) of the (unique) code. The lighting system may also comprise means for communicating with other systems or devices, such as on the basis of Bluetooth, WIFI, LiFi, ZigBee, BLE or WiMAX, or another wireless technology.

The system, or apparatus, or device may execute an action in a "mode" or "operation mode" or "mode of operation" or "operational mode". The term "operational mode may also be indicated as "controlling mode". Likewise, in a method an action or stage, or step may be executed in a "mode" or "operation mode" or "mode of operation" or "operational mode". This does not exclude that the system, or apparatus, or device may also be adapted for providing another controlling mode, or a plurality of other controlling modes. Likewise, this may not exclude that before executing the mode and/or after executing the mode one or more other modes may be executed.

However, in embodiments a control system may be available, that is adapted to provide at least the controlling mode. Would other modes be available, the choice of such modes may especially be executed via a user interface, though other options, like executing a mode in dependence of a sensor signal or a (time) scheme, may also be possible. The operation mode may in embodiments also refer to a system, or apparatus, or device, that can only operate in a single operation mode (i.e. "on", without further tunability).

Hence, in embodiments, the control system may control in dependence of one or more of an input signal of a user interface, a sensor signal (of a sensor), and a timer. The term "timer" may refer to a clock and/or a predetermined time scheme.

The term "plurality" refers to two or more.

The terms "substantially" or "essentially" herein, and similar terms, will be understood by the person skilled in the art. The terms "substantially" or "essentially" may also include embodiments with "entirely", "completely", "all", etc. Hence, in embodiments the adjective substantially or essentially may also be removed. Where applicable, the term "substantially" or the term "essentially" may also relate to 90% or higher, such as 95% or higher, especially 99% or higher, even more especially 99.5% or higher, including 100%.

The term "comprise" includes also embodiments wherein the term "comprises" means "consists of".

The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices, apparatus, or systems may herein amongst others be described during operation. As will be clear to the person skilled in the art, the invention is not limited to methods of operation, or devices, apparatus, or systems in operation.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim.

Use of the verb "to comprise" and its conjugations does not exclude the presence of elements or steps other than those stated in a claim. Unless the context clearly requires otherwise, throughout the description and the claims, the words "comprise", "comprising", and the like are to be construed in an inclusive sense as opposed to an exclusive or exhaustive sense; that is to say, in the sense of "including, but not limited to".

The article "a" or "an" preceding an element does not exclude the presence of a plurality of such elements.

The invention may be implemented by means of hardware comprising several distinct elements, and by means of a suitably programmed computer. In a device claim, or an apparatus claim, or a system claim, enumerating several means, several of these means may be embodied by one and the same item of hardware. The mere fact that certain measures are recited in mutually different dependent claims does not indicate that a combination of these measures cannot be used to advantage. In yet a further aspect, the invention (thus) provides a software product, which, when running on a computer is capable of bringing about (one or more embodiments of) the method as described herein.

The invention also provides a control system that may control the device, apparatus, or system, or that may execute the herein described method or process. Yet further, the invention also provides a computer program product, when running on a computer which is functionally coupled to or comprised by the device, apparatus, or system, controls one or more controllable elements of such device, apparatus, or system.

The invention further applies to a device, apparatus, or system comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Further, the person skilled in the art will understand that embodiments can be combined, and that also more than two embodiments can be combined. Furthermore, some of the features can form the basis for one or more divisional applications.

The invention claimed is:

1. A system comprising a printed circuit board, wherein:

the printed circuit board comprises one or more electrically conductive tracks; the printed circuit board comprises a first side and a second side; wherein the printed circuit board comprises a main part and an auxiliary part; wherein the main part is configured to host one or more electrical components, functionally coupled to at least one of the one or more electrically conductive tracks; wherein the main part comprises a through hole, wherein the through hole at least partially encloses the auxiliary part;

the printed circuit board comprises a breakaway structure configured between the auxiliary part and the main part; wherein the breakaway structure is configured to facilitate disconnection of the auxiliary part from the main part;

the main part comprises a first connecting hub and a second connecting hub, both configured at the first side, and configured at opposite sides of the through hole; wherein at least one of the first connecting hub and the second connecting hub is electrically connected to at least one of the one or more electrically conductive tracks;

the auxiliary part comprises a third connecting hub, configured at the first side, and configured between the first connecting hub and the second connecting hub;

the printed circuit board is functionally connectable to (i) a front-facing connector unit in a front-facing connector configuration, wherein the front-facing connector unit is connected to (a) the first connecting hub or second connecting hub and (b) the third connecting hub, the front-facing connector unit is connected to (a) the first connecting hub or the second connecting hub and (b) the third connecting hub via solder connections and (ii) a back-facing connector unit in a back-facing connector configuration, wherein the auxiliary part is absent, and wherein the back-facing connector unit is partly configured in the through hole and connected to the first connecting hub and the second connecting hub, the back-facing connector unit is connected to the first connecting hub and the second connecting hub via solder connections.

2. The system according to claim 1, wherein the breakaway structure comprises a perforation line.

3. The system according to claim 1, wherein the one or more electrical components comprise a solid state light source.

4. The system according to claim 1, wherein one or more of the first connecting hub, the second connecting hub, and the third connecting hub comprise a copper island.

5. The system according to claim 1, wherein the third connecting hub is not electrically connected to claim 1 of the electrically conductive tracks.

6. The system according to claim 1, wherein the through hole encloses the auxiliary part from at least three sides of the auxiliary part and the breakaway structure is configured at a fourth side of the auxiliary part.

7. The system according to claim 1, wherein the printed circuit board comprises a plurality of through holes.

8. The system according to claim 1, comprising at least two electrically conductive tracks, wherein the front-facing connector unit is a two pin connector, or wherein the back-facing connector is a two pin connector.

9. The system according to claim 1, further comprising the front-facing connector unit, wherein the front-facing connector unit comprises two front-facing connector hubs, which are electrically connected to each other, wherein the front-facing connector unit is functionally coupled to the printed circuit board in the front-facing connector configuration, wherein (a) the first connecting hub or the second connecting hub and (b) the third connecting hub are each connected to a respective front-facing connector hubs.

10. The system according to claim 1, further comprising the back-facing connector unit, wherein the back-facing connector unit comprises two back-facing connector hubs, which are electrically connected to each other, wherein the back-facing connector unit is functionally coupled to the printed circuit board in the back-facing connector configuration, and wherein the first connecting hub and the second connecting hub are each connected to one of the two back-facing connector hubs.

11. The system according to claim 9, wherein:

the front-facing connector unit comprises two front-facing connector hubs, which are electrically connected to each other.

12. The system according to claim 1, further comprising an electricity source for providing an electric current to the electrically conductive tracks of the system via one or more electrically conductive wires which are inserted into one or more of the connector units.

13. A method for assembling the system according to claim 1, the method comprising:

providing in a first stage the printed circuit board as defined in claim 1.

14. The method according to claim 13, the method comprising subsequent to the first stage a second stage comprising:

functionally connecting the front-facing connector unit in the front-facing connector configuration, wherein the front-facing connector unit is connected to (a) the first connecting hub or the second connecting hub and (b) the third connecting hub; or removing the auxiliary part from the printed circuit board by disconnecting via the breakaway structure, and functionally connecting the back-facing connector unit in the back-facing connector configuration, wherein the back-facing connector unit is partly configured in the through hole and connected to the first connecting hub and the second connecting hub.

15. A lighting device selected from the group of a lamp, a luminaire, a projector device, a disinfection device, a photochemical reactor, and an optical wireless communication device, comprising the system according to claim 1.

16. The system according to claim 10, wherein:

the back-facing connector unit comprises two back-facing connector hubs, which are electrically connected to each other.

* * * * *